US006859492B1

(12) United States Patent
Hillery

(10) Patent No.: US 6,859,492 B1
(45) Date of Patent: Feb. 22, 2005

(54) CONTROLLING AN ADAPTIVE EQUALIZER IN A DEMODULATOR

(75) Inventor: William J. Hillery, Santa Clara, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 172 days.

(21) Appl. No.: 09/698,990

(22) Filed: Oct. 27, 2000

Related U.S. Application Data

(62) Division of application No. 09/038,656, filed on Mar. 11, 1998, now Pat. No. 6,178,201.

(51) Int. Cl.[7] ................................................. H03H 7/30
(52) U.S. Cl. ...................................................... 375/232
(58) Field of Search ................................ 375/232, 230, 375/229, 233

(56) References Cited

U.S. PATENT DOCUMENTS 4,605,966 A * 8/1986 Collins ....................... 348/616
5,311,546 A * 5/1994 Paik et al. ................... 375/232
5,491,518 A * 2/1996 Kim ............................ 375/233
5,506,871 A * 4/1996 Hwang et al. ............... 375/230
5,513,215 A * 4/1996 Marchetto et al. .......... 375/233
5,712,873 A * 1/1998 Shiue et al. ................. 375/233
5,937,007 A * 8/1999 Raghunath .................. 375/232
6,067,319 A * 5/2000 Copeland .................... 375/232

FOREIGN PATENT DOCUMENTS

JP          07212299      *  8/1995   ............ H04B/7/26

* cited by examiner

Primary Examiner—Kevin M Burd

(57) ABSTRACT

An adaptive equalizer for a demodulator includes a filter that generates a filter output signal in response to an information signal according to a transfer function for the filter. The adaptive equalizer includes means for adjusting the transfer function in response to an indication of error in the filter output signal, and means for switching among a set of differing determinations of the indication of error. Switching among the differing determinations may be based upon a variety of indications of the progress of adaptation in the equalizer.

15 Claims, 4 Drawing Sheets

CONTROLLING AN ADAPTIVE EQUALIZER IN A DEMODULATOR

CROSS REFERENCE TO RELATED APPLICATION(S)

This is a divisional of application Ser. No. 09/038,656 filed on Mar. 11, 1998, now U.S. Pat. No. 6,178,201.

BACKGROUND OF THE INVENTION

1. Field of Invention

The present invention pertains to the field of demodulators. More particularly, this invention relates to controlling an adaptive equalizer in a demodulator.

2. Art Background

Communication systems commonly employ signal modulation to generate an information signal which is suitable for transmission via a physical communication path. For example, signal modulation is commonly employed in communication systems that transport information signals via transmission lines. Such communication systems include cable networks.

Such a communication system usually includes a transmitting station having a modulator that generates the information signal and a receiving station having a demodulator that extracts the information carried by the information signal. Typically, the transmitting and receiving stations' are interconnected via one or more physical communication paths.

The communication paths in a typical communication system commonly include a variety of elements which introduce imperfections into the information signal. For example, transmission line connectors commonly cause signal reflections that distort the information signal. In addition, components such as signal amplifiers and filters may distort the information signal. Moreover, communication paths commonly have non-linear frequency and phase response which introduces further distortions into an information signal.

Prior demodulators may include an adaptive equalizer which is intended to compensate for the distortions which may be introduced into the information signal during transmission. A typical adaptive equalizer includes a filter and circuitry that continually adapts the filter according to a particular adaptation method. Prior adaptation methods are usually based upon a determination of an error measure for the adaptive equalizer. The adaptive equalizer is said to reach convergence when this error measure is small enough to yield a reliable output signal for the demodulator.

An adaptive equalizer may be classified as either blind or non-blind. A non-blind adaptive equalizer may be defined as an equalizer that adapts to a training sequence of symbols which is periodically carried in the information signal. A blind adaptive equalizer may be defined as an equalizer that adapts to a random symbol sequence in the information signal without the aid of a training sequence. It may in some systems be desirable to employ a blind adaptive equalizer. For example, a blind adaptive equalizer would eliminate the need for a training sequence which would ordinarily decrease the information throughput of a communication system.

Unfortunately, prior adaptation methods which may be useful for a blind adaptive equalizer commonly have difficulty in reaching a desirable point of convergence. For example, a common prior adaptation method in a blind adaptive equalizer employs a constant modulus algorithm (CMA) to recursively determine an error measure. Typically, the CMA adaptation method initially moves an equalizer toward convergence. The CMA adaptation method, however, usually has difficulty reaching a point of convergence that will yield a reliable output signal for the demodulator.

SUMMARY OF THE INVENTION

An adaptive equalizer for a demodulator is disclosed which switches among differing adaptation methods depending upon the progress of adaptation. The adaptive equalizer includes a filter that generates a filter output signal in response to an information signal according to a transfer function for the filter. The adaptive equalizer includes means for adjusting the transfer function in response to an indication of error in the filter output signal, and means for switching among a set of differing determinations of the indication of error. Switching among the differing determinations may be based upon a variety of indications of the progress of adaptation in the equalizer.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
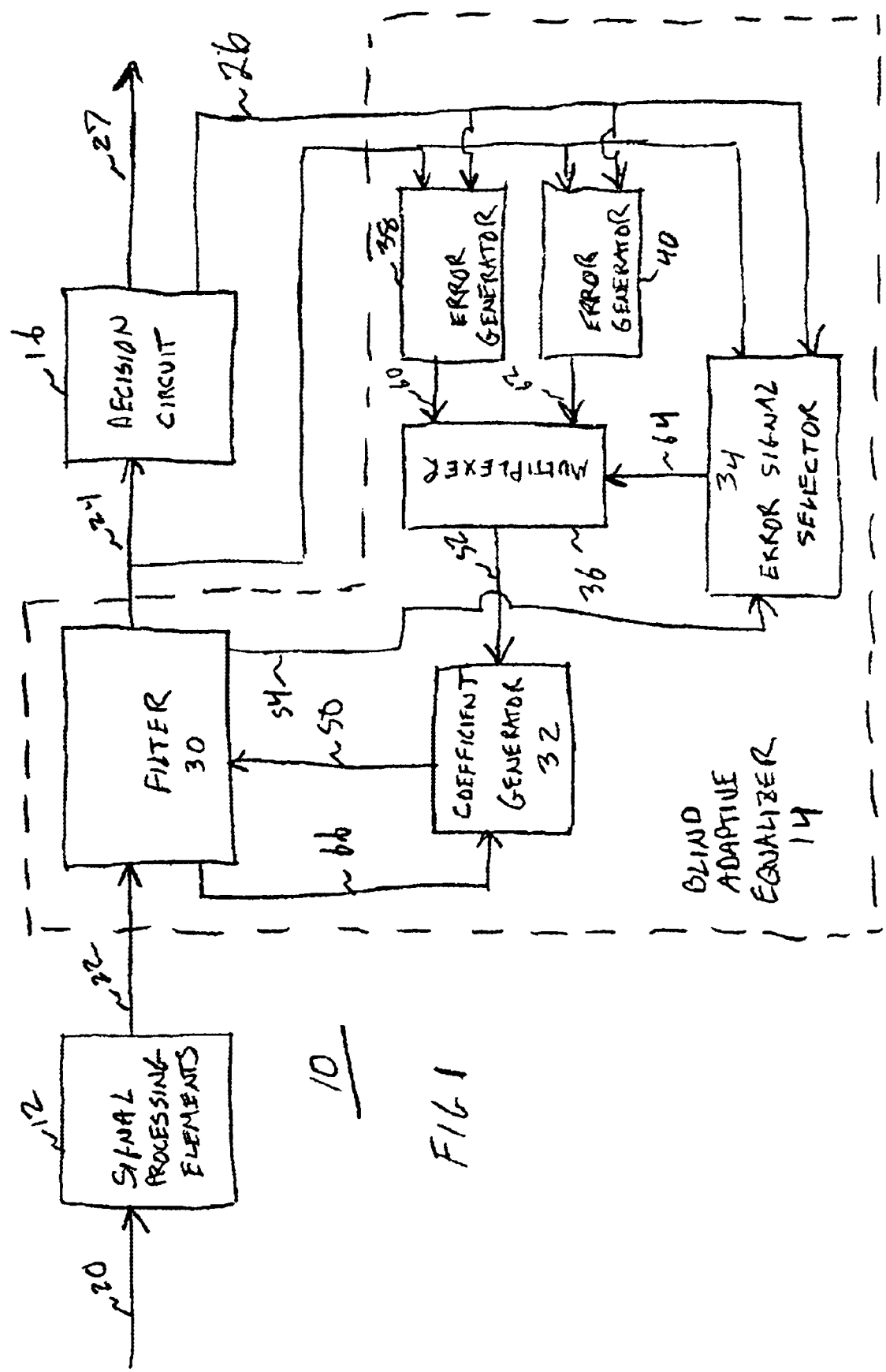
FIG. 1 illustrates a demodulator which includes a blind adaptive equalizer that switches among differing adaptation methods.

FIG. 1 illustrates a demodulator 10 which includes a blind adaptive equalizer 14 that switches among differing adaptation methods. The demodulator 10 also includes a set of signal processing elements 12 and a decision circuit 16. In one embodiment, the demodulator 10 is a 64-QAM demodulator which is characterized by a set of 64 constellation points each representing a symbol.

The signal processing elements 12 receive an information signal 20 which has been transported via a communication channel or a communication network. The communication channel or network may be embodied in one or more of a variety of physical communication paths including transmission line networks and broadcast communication channels. In one embodiment, the information signal 20 is received via an RF amplifier and associated circuitry which are coupled to a cable network.

The signal processing elements 12 perform a variety of signal processing functions to provide an input signal 22 for the equalizer 14. In one embodiment, the signal processing elements 12 include an analog-to-digital converter, an automatic gain control, a matched filter, and a timing recovery function, as well as other signal processing elements.

A filter 30 generates a filter output signal 24 in response to the input signal 22. In one embodiment, the filter 30 is a digital filter. In another embodiment, the filter 30 is a discrete time filter.

The relationship between the filter output signal 24 and the input signal 22 is defined by a transfer function associated with the filter 30. The transfer function of the filter 30 is controllable and may be adjusted by the modification of a set of filter coefficients 50 which are generated by a coefficient generator 32.

The decision circuit 16 generates an output signal 26 and an output signal 27 in response to the filter output signal 24. The output signal 27 is phase corrected and the output signal 26 is not phase corrected. The decision circuit 16 generates the phase-corrected output signal 27 by performing carrier recovery on the filter output signal 24 and selecting from among a set of predetermined constellation points which best match the symbols carried by the filter output signal 24. The output signal 26 is the phase-corrected output signal 27 with phase correction removed. The predetermined constellation points are each represented by a complex number. Each predetermined constellation point has a real component and an imaginary component.

The coefficient generator 32 adapts the filter 30 to distortions or imperfections in the communication channel over which the information signal 20 was transported by continuously updating the filter coefficients 50 in response to an error signal 52. The coefficient generator 32 updates the filter coefficients 50 according to the following:

$$W_n(k+1)=W_n(k)+e_{SEL}(k+1)y^*(k-n)$$

where k is time, $e_{SEL}$ is the selected error signal 52, n is the filter coefficient number (filter tap number), $W_n$ is the filter coefficient for filter tap n, and y(k−n) is the $n^{th}$ entry in the delay line 66 at time k, and "*" indicates a complex conjugate.

The n filter taps from the filter 30 are provided to the coefficient generator 32 via a set of signal lines 66. In addition to the equation set forth above, there are sign-based adaptation methods for generating updated filter coefficients which may be implemented in the coefficient generator 32.

The error signal 52 is selected from among a set of differing error signals, N error signals in general. In one embodiment, N is 2 and the error signal 52 is selected as either an error signal 60 generated by an error generator 38 or an error signal 62 generated by an error generator 40. The equalizer 14 includes a multiplexer 36 that selects either the error signal 60 or the error signal 62 in response to a control signal 64 generated by an error signal selector 34.

The error generator 38 implements a preselected adaptation method which converges on a circle and is well suited for blind equalizers, i.e. to adaptations which are undertaken when no training symbol sequences are available in the information signal 20. The error generator 38 determines an error in the filter output signal 24 and continuously updates the error signal 60 in response to this error determination. In one embodiment, the error generator 38 performs its error determination according to a constant modulus algorithm (CMA) which is as follows:

$$e_{CMA}(k+1)=\mu_{CMA}(R_2-|Z_k|^2)\,Z_k$$

where k is time, $e_{CMA}$ is the error signal 60, $\mu_{CMA}$ is a step size for the CMA algorithm, $R_2$ is a constellation dependent constant, and $Z_k$ is the filter output signal 24.

The error generator 40, on the other hand, implements an adaptation method which is decision-directed toward the constellation points for the demodulator 10. The error generator 40 determines an error in the filter output signal 24 and continuously updates the error signal 62 in response to this error determination. In one embodiment, the error generator 40 renders its error determination according a least mean-square (LMS) determination which is as follows:

$$e_{LMS}(k+1)=\mu_{LMS}(\hat{x}_k-Z_k)$$

where k is time, $e_{LMS}$ is the error signal 62, $\mu_{LMS}$ is a step size for the LMS algorithm, $\hat{x}_k$ is the output signal 26, and $Z_k$ is the filter output signal 24.

The error signals 60 and 62 are both indicators of the error between the output signal 26 and the filter output signal 24. The process by which the adaptive equalizer 14 adjusts the transfer function of the digital filter 30 in a manner that reduces the error between the output signal 26 and the filter output signal 24 is called convergence. The adaptation method provided by the error generator 38 is selected for its efficiency in converging when relatively large differences exist between the output signal 26 and the filter output signal 24 as is common at the beginning of a convergence operation when no training symbols are available. On the other hand, the adaptation method provided by the error generator 40 is selected for its efficiency in accurately converging when relatively small differences exist between the output signal 26 and the filter output signal 24.

The error signal selector 34 generates a set of status conditions and uses the status conditions to switch between the error signals 60–62, where appropriate, to properly converge the adaptive equalizer 14 and compensate for the distortions in the input signal 22 which may have been caused by imperfections in the communication channel over which the information signal 22 was transported. The status conditions generally reflect the progress of a convergence operation being undertaken. The status conditions may reflect one or more thresholds in the signal-to-noise ratio of the demodulator 10. The status conditions may also indicate whether a center tap of the filter 30 is outside of a predetermined range. The status conditions may also indicate the absence of outer rim constellation points. The error signal selector 34 uses the filter output signal 24, the output signal 26, and a center tap signal 54 from the digital filter 30 to determine the status conditions.

Figure 2:
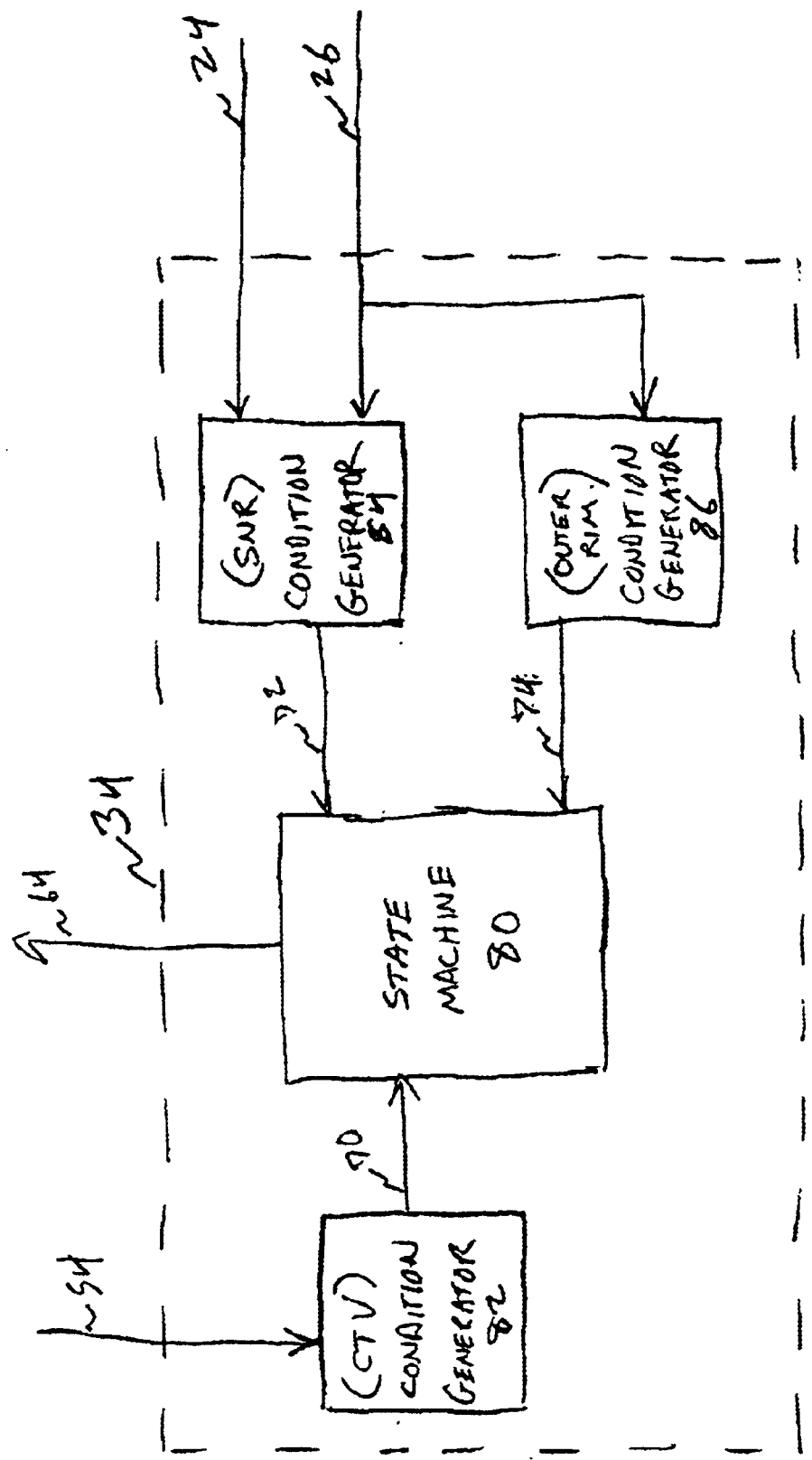
FIG. 2 illustrates an error signal selector in one embodiment of the blind adaptive equalizer.

FIG. 2 illustrates the error signal selector 34 in one embodiment. In this embodiment, the error signal selector 34 includes a state machine 80 and a set of condition generators 82–86. The state machine 80 switches the control signal 64 to select from among the error signals 60–62 in response to a set of control signals 70–74 which reflect the status conditions for a convergence operation. The control signals 70–74 are generated by the condition generators 82–86.

The condition generator 82 detects false or improper convergence states which may occur where the center tap of the digital filter 30 is too large or too small or in the wrong position. In addition, the condition generator 82 detects when the equalizer 14 is not making progress toward convergence as may be indicated when the center tap of the digital filter 30 drifts outside a predetermined range. Any one or more of these conditions may be referred to as a center tap violation (CTV). The condition generator 82 uses the center tap signal 54 from the digital filter 30 to detect a CTV and asserts the control signal 70 to indicate a CTV to the state machine 80 if one of the following conditions is true.

(|Re (C0)|<Cmin) AND (|Im(C0)|<Cmin)

(|Re(C0)|>Cmax) OR (|Im(C0)|>Cmax)

where C0 is the complex value of the center tap signal 54, Re(C0) is the real part of C0, Im(C0) is the imaginary part of C0, Cmin is the minimum allowed center tap value, and Cmax is the maximum allowed center tap value.

The condition generator 84 uses the filter output signal 24 and the output signal 26 to determine a signal-to-noise ratio (SNR) in the demodulator 10. The signal level for the SNR determination is indicated by the signal power of the output signal 26 and the noise level for the SNR determination is indicated by the signal power of the difference between the filter output signal 24 and the output signal 26. The condition generator 84 compares the determined SNR to a set of SNR threshold values. These include an upper SNR threshold value, a convergence SNR threshold value, and a loss of convergence SNR threshold value.

The condition generator 84 indicates an Up_Threshold condition on the control signal 72 when the determined SNR is greater than the upper SNR threshold value. The Up_Threshold condition indicates that the adaptation method provided by the error generator 38, CMA in one embodiment, has obtained sufficient convergence to enable a switch to the adaptation method provided by the error generator 40, which in one embodiment is LMS.

The condition generator 84 indicates a Conv_Thresh condition on the control signal 72 when the determined SNR increases above the convergence SNR threshold value. This indicates that the adaptation method provided by the error generator 40 has obtained a high enough SNR in the demodulator 10 for a declaration of convergence by the equalizer 14.

The condition generator 84 indicates an Lconv_Thresh condition on the control signal 72 after the equalizer 14 has converged if the determined SNR dips below the loss of convergence SNR threshold value. The Lconv_Thresh condition indicates a possible loss of convergence in the equalizer 14. The condition generator 84 indicates an #Lconv_Thresh condition on the control signal 72 if the determined SNR rises above the loss of convergence SNR threshold value.

The condition generator 86 detects the lack of outer rim constellation points in the output signal 26. For example, an outer rim constellation point for 64-QAM has a real component value of 3.5 in which case the condition generator 86 detects the lack of real component values of 3.5 in the output signal 26. The condition generator 86 asserts the control signal 74 to indicate a No_Outer_Rim condition if an outer rim value has not been detected within a predetermined number of previous symbols carried by the output signal 26. In one embodiment, the condition generator 86 includes a counter which counts symbols and resets and reloads with a predetermined value whenever an outer rim value occurs. If this counter expires then the No_Outer$_{13}$ Rim condition is generated.

The No_Outer_Rim condition is used by the state machine 80 to prevent a false convergence of the equalizer 14. If a false convergence occurs, the converged constellation is a smaller and noisier version of the actual constellation for the demodulator 10. The lack of outer rim values is an indication of possible convergence to a false constellation.

Figure 3:
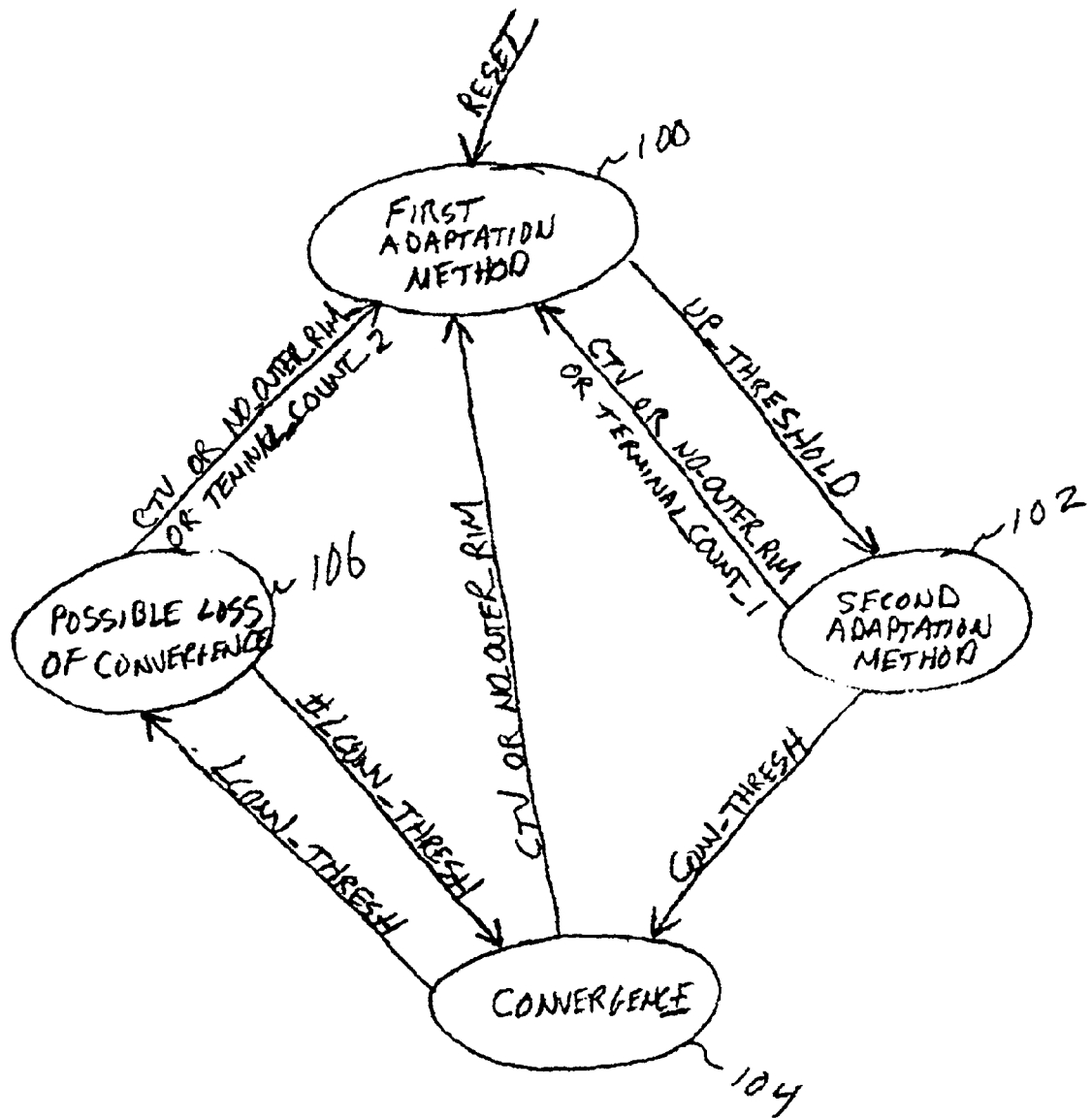
FIG. 3 is a diagram that shows the state transitions of a state machine in the error signal selector in one embodiment.

FIG. 3 is a diagram that shows the state transitions of the state machine 80 in one embodiment. The states of the state machine 80 include a first adaptation method state 100, a second adaptation method state 102, a convergence state 104, and a possible loss of convergence state 106. Also shown are the status conditions as indicated on the control signals 70–74 that cause transitions among the states 100–106.

The state machine 80 enters the first adaptation method state 100 at reset or initialization. While in the state 100, the state machine 80 uses the control signal 64 to select the error signal 60 from the error generator 38 for use by the coefficient generator 32. In one embodiment, this results in the use of the CMA adaptation method when updating the filter coefficients 50. The state machine 80 remains in the first adaptation method state 100 so that the equalizer 14 uses the error signal 60 to converge until the condition generator 84 signals the Up_Threshold condition. The Up_Threshold condition causes the state machine 80 to transition to the second adaptation method at state 102.

While in the state 102, the state machine 80 uses the control signal 64 to select the error signal 62 from the error generator 40. In one embodiment, this results in the use of the LMS adaptation method when updating the filter coefficients 50. The state machine 80 transitions from the state 102 to the convergence state 104 once the condition generator 84 signals the Conv_Thresh condition. This indicates that the SNR in the demodulator 10 is high enough to declare the convergence of the equalizer 14. On the other hand, the state machine 80 falls back from the state 102 to the state 100 if the condition generator 82 signals the CTV condition or if the condition generator 86 signals the No_Outer_Rim condition.

The state machine 80 includes a first counter which is loaded with a value indicating a maximum number of symbols for which the equalizer 14 will attempt to converge using the adaptation method of the error generator 40 in the state 102. While in the state 102, the state machine 80 decrements the first counter for each symbol. If the first counter expires while in the state 102 then the Terminal_Count_1 condition is indicated and the state machine 80 falls back to the state 100 to restart the convergence process.

In the convergence state 104 the output signal 26 is considered to have good data and the state machine 80 continues to select the error signal 62 to maintain convergence. A CTV or a No_Outer_Rim indication in the convergence state 104 causes the state machine 80 to fall all the way back to the state 100 to restart the convergence process. While in the convergence state 104, the Lconv_Thresh condition from the condition generator 84 causes the state machine 80 to transition to the possible loss of convergence state 106.

While in the possible loss of convergence state 106, the state machine 80 continues to select the error signal 62 for use by the coefficient generator 32. A subsequent #Lconv_Thresh condition from the condition generator 84 restores the state machine 80 to the convergence state 104. This maintains the use of the more finely tuned adaptation method of the error generator 40 in case the reduced SNR was caused by short term effects on the communication channel that transports the information signal 20.

A CTV condition or a No_Outer_Rim condition causes the state machine 80 to fall out of the possible loss of convergence state 106 to the state 100 to restart the convergence process. The state machine 80 includes a second counter which is loaded with a value indicating a maximum number of symbols for which the equalizer 14 will attempt to re-attain convergence while in the possible loss of convergence state 106. While in the possible loss of convergence state 106, the state machine 80 decrements the second counter for each symbol. If the second counter expires as indicated by the Terminal_Count_2 condition then the state machine 80 transitions to the state 100 to restart the convergence process.

Figure 4:
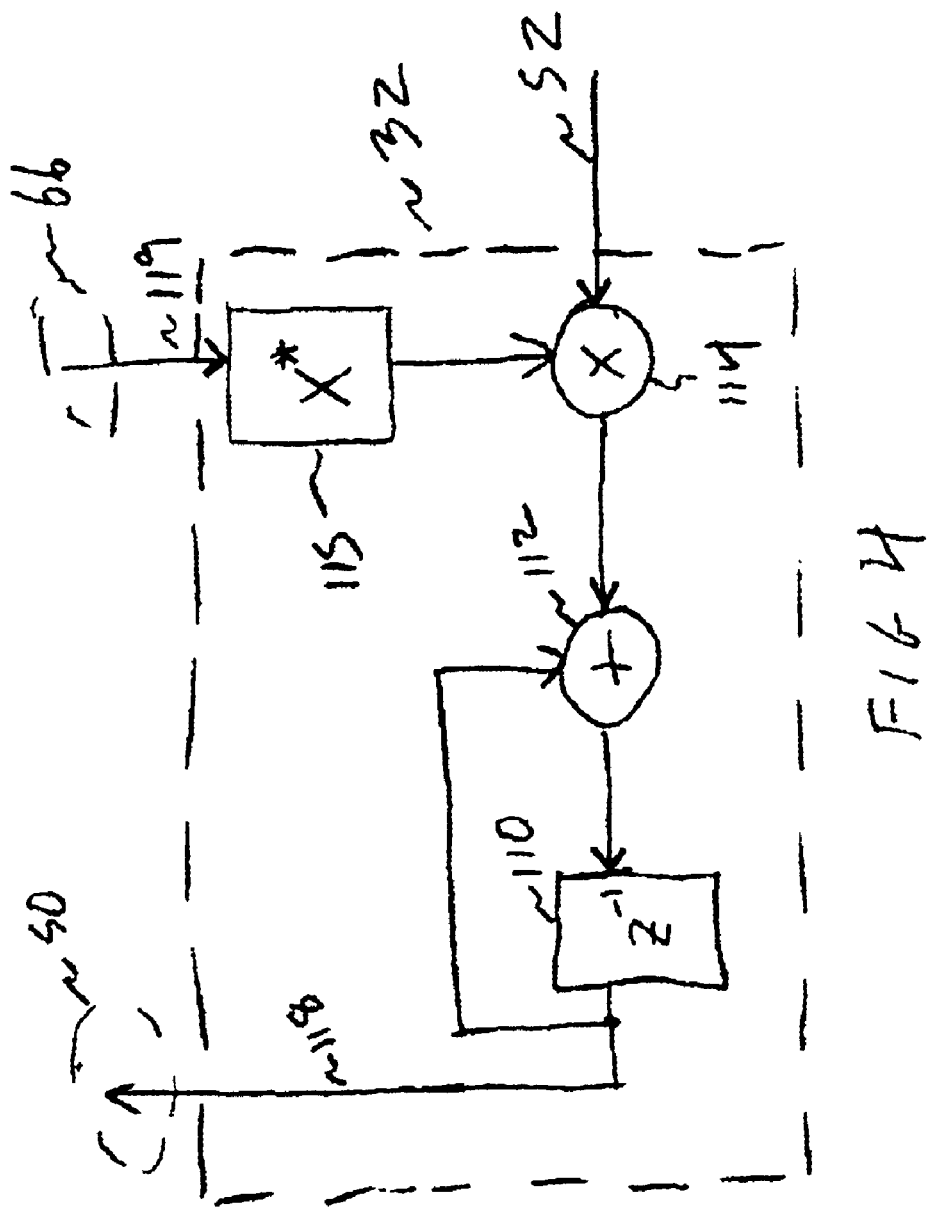
FIG. 4 illustrates elements of the coefficient generator.

FIG. 4 illustrates elements of the coefficient generator 32. The coefficient generator 32 includes a delay element, an adder, a complex conjugate block, and a multiplier for each of the filter coefficients 50. For generating a filter coefficient 118, the coefficient generator 32 includes a delay element 110 such as a register or flip-flop, an adder 112, a multiplier 114 and a complex conjugate block 115.

The complex conjugate block 115 generates a conjugate of a corresponding filter tap 119. The multiplier 114 multiplies the output of the complex conjugate block 115 by the selected error signal 52. The delay element 110 stores a previous coefficient w(k) and the adder 112 generates an updated coefficient w(k+1) by adding the previous coefficient w(k) to the output of the multiplier 114. The output of the delay element 110 provides the filter coefficient 118 for the corresponding filter tap 119.

The filter 30 may be implemented in a variety of arrangements including a simple feed-forward filter and a filter having feed-forward and feed-back elements. In one embodiment, the filter 30 includes a feed-forward filter from the input signal 22 and a feed-back filter from the output signal 26. The outputs of the feed-forward and feedback filter are summed to provide the filter output signal 24. The center tap signal 54 is the last tap in the feed-forward filter.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. An adaptive equalizer in a demodulator for an information signal without a training sequence, comprising:
    filter that generates a filter output signal in response to the information signal according to a transfer function for the filter wherein the transfer function is determined by a set of filter coefficients;
    coefficient generator that adapts the filter by updating the filter coefficients in response to a selected error signal;
    error generator that generates a first error signal using an error determination that is preselected for adapting the filter coefficients in response to a relatively large error in the filter output signal;
    error generator that generates a second error signal using an error determination that is preselected for adapting the filter coefficients in response to a relatively small error in the filter output signal;
    circuit that provides the selected error signal to the coefficient generator by selecting among the first and second error signals in response to an SNR ratio of a signal power of an output signal of the demodulator to a signal power of a noise level in the output signal.

2. The adaptive equalizer of claim 1, wherein the circuit that provides the selected error signal initially selects the first error signal and then selects the second error signal if the SNR ratio exceeds a first predetermined threshold.

3. The adaptive equalizer of claim 1, wherein the circuit that provides the selected error signal initially selects the first error signal and then selects the second error signal if the SNR ratio exceeds a first predetermined threshold and then selects the first error signal if the SNR ratio falls below a second predetermined threshold after a convergence is reached.

4. The adaptive equalizer of claim 3, wherein the convergence is reached if the SNR ratio exceeds a third predetermined threshold.

5. The adaptive equalizer of claim 1, wherein the circuit that provides the selected error signal comprises:
    multiplexer that selectively couples the first and second error signals to the coefficient generator;
    a status condition generator that generates a status condition in response to the SNR ratio indicating progress in adapting the filter;
    state machine that causes the multiplexer to switch among the first and second error signals in response to the status condition.

6. A method for adaptive equalization in a demodulator for an information signal without a training sequence, comprising the steps of:
    generating a filter output signal in response to the information signal according to a transfer function that is determined by a set of filter coefficients;
    adapting the filter by updating the filter coefficients in response to a selected error signal;
    generating a first error signal using an error determination that is preselected for adapting the filter coefficients in response to a relatively large error in the filter output signal;
    generating a second error signal using an error determination that is preselected for adapting the filter coefficients in response to a relatively small error in the filter output signal;
    selecting among the first and second error signals as the selected error signal in response to an SNR ratio of a signal power of an output signal of the demodulator to a signal power of a noise level in the output signal.

7. The method of claim 6, wherein the step of selecting comprises the steps of selecting the first error signal and then selecting the second error signal if the SNR ratio exceeds a first predetermined threshold.

8. The method of claim 6, wherein the step of selecting comprises the steps of selecting the first error signal and then selecting the second error signal if the SNR ratio exceeds a first predetermined threshold and then selecting the first error signal if the SNR ratio falls below a second predetermined threshold after a convergence is reached.

9. The method of claim 8, further comprising the step of detecting the convergence by determining if the SNR ratio exceeds a third predetermined threshold.

10. The method of claim 6, wherein the step of selecting comprises the steps of:
    generating a status condition in response to the SNR ratio indicating progress in adapting the filter;
    switching among the first and second error signals in response to the status condition.

11. An apparatus for adaptive equalization in a demodulator for an information signal without a training sequence, comprising:
    means for generating a filter output signal in response to the information signal according to a transfer function that is determined by a set of filter coefficients;
    means for adapting the filter by updating the filter coefficients in response to a selected error signal;
    means for generating a first error signal using an error determination that is preselected for adapting the filter coefficients in response to a relatively large error in the filter output signal;
    means for generating a second error signal using an error determination that is preselected for adapting the filter coefficients in response to a relatively small error in the filter output signal;
    means for selecting among the first and second error signals as the selected error signal in response to an SNR ratio of a signal power of an output signal of the demodulator to a signal power of a noise level in the output signal.

12. The apparatus of claim 1, wherein the means for selecting comprises means for selecting the first error signal and then selecting the second error signal if the SNR ratio exceeds a first predetermined threshold.

13. The apparatus of claim 1, wherein the means for selecting comprises means for selecting the first error signal and then selecting the second error signal if the SNR ratio exceeds a first predetermined threshold and then selecting the first error signal if the SNR ratio falls below a second predetermined threshold after a convergence is reached.

14. The apparatus of claim 13, further comprising means for detecting the convergence by determining if the SNR ratio exceeds a third predetermined threshold.

15. The apparatus of claim 11, wherein the means for selecting comprises:
   means for generating a status condition in response to the SNR ratio indicating progress in adapting the filter;
   means for switching among the first and second error signals in response to the status condition.

* * * * *